US012628363B2

(12) United States Patent
Gejo

(10) Patent No.: US 12,628,363 B2
(45) Date of Patent: May 12, 2026

(54) REVERSE CONDUCTING INSULATED GATE BIPOLAR TRANSISTOR WITH SPECIFIC IMPURITY CONCENTRATIONS

(71) Applicants:KABUSHIKI KAISHA TOSHIBA, Tokyo (JP); TOSHIBA ELECTRONIC DEVICES & STORAGE CORPORATION, Tokyo (JP)

(72) Inventor: Ryohei Gejo, Kawasaki Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 799 days.

(21) Appl. No.: 17/868,236

(22) Filed: Jul. 19, 2022

(65) Prior Publication Data

US 2023/0223464 A1     Jul. 13, 2023

(30) Foreign Application Priority Data

Jan. 7, 2022     (JP) ................................. 2022-001747

(51) Int. Cl.
*H10D 12/00*          (2025.01)
*H10D 62/10*          (2025.01)
(Continued)

(52) U.S. Cl.
CPC ......... *H10D 12/441* (2025.01); *H10D 62/106* (2025.01); *H10D 62/126* (2025.01);
(Continued)

(58) Field of Classification Search
CPC .. H10D 62/106; H10D 62/126; H10D 62/393; H10D 62/60; H10D 64/514; H10D 64/517; H10D 12/441
See application file for complete search history.

(56) References Cited

U.S. PATENT DOCUMENTS 9,147,758 B2    9/2015   Senoo
9,214,535 B2    12/2015   Matsudai et al.
(Continued)

FOREIGN PATENT DOCUMENTS

JP     2014-103376 A     6/2014
JP     2015118989 A     6/2015
(Continued)

OTHER PUBLICATIONS

Notice of Reasons for Refusal (Office Action) dated Feb. 28, 2025 in corresponding Japanese Patent Application No. 2022-001747 with English machine translation (14 pages).
(Continued)

*Primary Examiner* — Davienne N Monbleau
*Assistant Examiner* — Heim Kirin Grewal
(74) *Attorney, Agent, or Firm* — Kim & Stewart LLP

(57)     ABSTRACT

A semiconductor device includes a semiconductor part, first and second electrodes and a control electrode. The semiconductor part is provided between the first and second electrodes. The control electrode is provided between the semiconductor part and the second electrode. The semiconductor part includes first, third and fifth layers of a first conductivity type, and second, fourth, sixth and seventh layers of a second conductivity type. The second layer is provided between the first layer and the second electrode. The third layer is provided between the second layer and the second electrode. The fourth and fifth layers are provided between the first layer and the first electrode. The sixth layer surrounds the second and third layers. The seventh layer is provided between the first layer and the first electrode. The seventh layer surrounds the fourth and fifth layers and is apart from the fourth and fifth layers.

21 Claims, 5 Drawing Sheets

(51) Int. Cl.

| | | |
|---|---|---|
| *H10D 62/17* | (2025.01) | |
| *H10D 62/60* | (2025.01) | |
| *H10D 64/27* | (2025.01) | |

(52) U.S. Cl.

CPC ........... *H10D 62/393* (2025.01); *H10D 62/60* (2025.01); *H10D 64/514* (2025.01); *H10D 64/517* (2025.01)

(56) References Cited

U.S. PATENT DOCUMENTS

| | | | |
|---|---|---|---|
| 10,510,904 B2 | 12/2019 | Masuoka et al. | |
| 2010/0276727 A1 | 11/2010 | Storasta et al. | |
| 2014/0084337 A1* | 3/2014 | Matsudai ............. | H10D 12/038 257/140 |
| 2015/0171199 A1 | 6/2015 | Senoo | |
| 2016/0260703 A1 | 9/2016 | Nakamura | |
| 2019/0287961 A1* | 9/2019 | Naito ..................... | H10D 12/01 |
| 2019/0319026 A1* | 10/2019 | Yoshida ............... | H10D 64/519 |
| 2020/0357883 A1 | 11/2020 | Pfaffenlehner et al. | |

FOREIGN PATENT DOCUMENTS

| | | | |
|---|---|---|---|
| JP | 5967065 B2 | 8/2016 | |
| JP | 6288315 B2 | 3/2018 | |
| JP | 2019186504 A | 10/2019 | |

OTHER PUBLICATIONS

Chen, Weizhong, et al. "A snapback suppressed reverse-conducting IGBT with built-in diode by utilizing edge termination" Superlattices and Microstructures, vol. 70, 2014, pp. 109-116 (8 pages).

\* cited by examiner

REVERSE CONDUCTING INSULATED GATE BIPOLAR TRANSISTOR WITH SPECIFIC IMPURITY CONCENTRATIONS

CROSS-REFERENCE TO RELATED APPLICATIONS

This application is based upon and claims the benefit of priority from Japanese Patent Application No. 2022-001747, filed on Jan. 7, 2022; the entire contents of which are incorporated herein by reference.

FIELD

Embodiments relate to a semiconductor device.

BACKGROUND

A power control semiconductor device is required to have large tolerance for overcurrent in the on-state.

DETAILED DESCRIPTION

Figure 1:
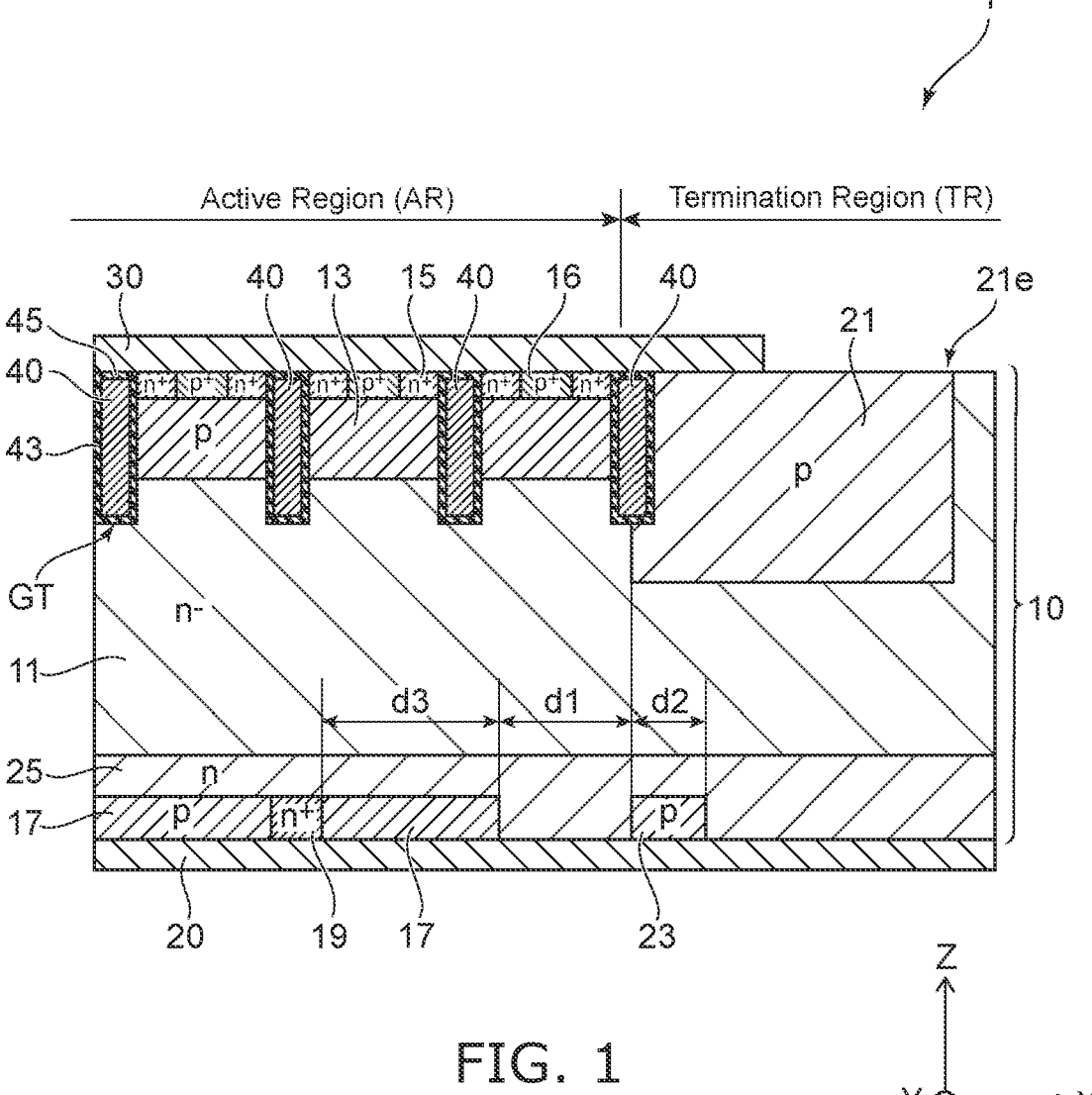
FIG. 1 is a schematic cross-sectional view showing a semiconductor device according to an embodiment.

According to one embodiment, a semiconductor device includes a semiconductor part, a first electrode, a second electrode and a control electrode. The semiconductor part includes an active region and a termination region, the termination region surrounding the active region. The first electrode is provided on a back surface of the semiconductor part. The second electrode is provided on a front surface of the semiconductor part, the front surface being at a side opposite to the back surface. The control electrode is provided between the semiconductor part and the second electrode. The semiconductor part includes first to seventh layers. The first, third and fifth layers are of a first conductivity type, and the second, fourth, sixth and seventh layers are of a second conductivity type. The first layer is provided between the first electrode and the second electrode. The second layer is provided between the first layer and the second electrode. The third layer is provided between the second layer and the second electrode. The fourth and fifth layers are provided between the first layer and the first electrode. The fourth and fifth layers are arranged along the first electrode. The sixth layer is provided in the termination region and surrounds the second and third layers at the front side of the semiconductor part. The seventh layer is provided in the termination region. The seventh layer is provided between the first layer and the first electrode. The seventh layer surrounds the fourth and fifth layers, and is apart from the fourth and fifth layers. A distance from the active region to an outer edge of the seventh layer is less than a distance from the active region to an outer edge of the sixth layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic cross-sectional view showing a semiconductor device 1 according to an embodiment. The semiconductor device 1 is a RCIGBT (Reverse Conducting Insulated Gate Bipolar Transistor). The semiconductor device 1 includes, for example, a semiconductor part 10, a collector electrode 20, an emitter electrode 30, and a gate electrode 40. The semiconductor part 10 is, for example, silicon.

The collector electrode 20 (a first electrode) is provided on the back surface of the semiconductor part 10. The emitter electrode 30 (a second electrode) is provided on the front surface of the semiconductor part 10. The front surface is at the side opposite to the back surface. The gate electrode 40 (a control electrode) is provided between the semiconductor part 10 and the emitter electrode 30.

The semiconductor part 10 includes multiple gate trenches GT provided in the front side. The gate electrodes 40 are provided inside the multiple gate trenches GT, respectively. The gate electrode 40 is electrically insulated from the semiconductor part 10 by a gate insulating film 43 (a first insulating film). Also, the gate electrode 40 is electrically insulated from the emitter electrode 30 by an inter-layer insulating film 45 (a second insulating film).

The semiconductor part 10 includes, for example, an n-type base layer 11, a p-type base layer 13, an n-type emitter layer 15, a p-type emitter layer 16, a p-type collector layer 17, and an n-type cathode layer 19. In the description herein, the first conductivity type is an n-type, and the second conductivity type is a p-type.

The n-type base layer 11 (a first layer) extends between the collector electrode 20 and the emitter electrode 30. The n-type base layer 11 extends, for example, in an X-direction and a Y-direction and spreads over the entire semiconductor part 10. The gate trench GT extends into the n-type base layer 11 from the front surface of the semiconductor part 10. The gate electrode 40 also extends from the front side of the semiconductor part 10 into the n-type base layer 11. The gate electrode 40 is provided inside the gate trench GT with the gate insulating film 43 interposed.

The p-type base layer 13 (a second layer) is provided between the n-type base layer 11 and the emitter electrode 30. The p-type base layer 13 is provided between the gate electrodes 40 that are next to each other. The p-type base layer 13 faces the gate electrode 40 via the gate insulating film 43, for example, in the X-direction.

The n-type emitter layer 15 (a third layer) is provided between the p-type base layer 13 and the emitter electrode 30. The n-type emitter layer 15 contacts the gate insulating film 43. The n-type emitter layer 15 has an n-type impurity concentration higher than an n-type impurity concentration of the n-type base layer 11.

The n-type emitter layer 15 and the p-type emitter layer 16 are arranged between the p-type base layer 13 and the emitter electrode 30. The p-type emitter layer 16 has a p-type impurity concentration higher than a p-type impurity concentration of the p-type base layer 13.

The n-type emitter layer 15 and the p-type emitter layer 16 are arranged along for example, the front surface of the semiconductor part 10. The emitter electrode 30 is in contact with the n-type emitter layer 15 and the p-type emitter layer 16 and electrically connected thereto. Also, the emitter electrode 30 is electrically connected to the p-type base layer 13 via the p-type emitter layer 16.

The p-type collector layer 17 (a fourth layer) is provided between the n-type base layer 11 and the collector electrode 20. The p-type collector layer 17 is in contact with the collector electrode 20 and electrically connected thereto.

The p-type collector layer 17 and the n-type cathode layer 19 (a fifth layer) are arranged between the n-type base layer 11 and the collector electrode 20. The p-type collector layer 17 and the n-type cathode layer 19, for example, are alternately arranged along the back surface of the semiconductor part 10. The n-type cathode layer 19 is in contact with the collector electrode 20 and electrically connected thereto.

The semiconductor part 10 includes, for example, an active region AR and a termination region TR. The active region AR includes the p-type base layer 13, the n-type emitter layer 15, the p-type emitter layer 16, the p-type collector layer 17, and the n-type cathode layer 19 that form a major path of the current when operating the semiconductor device 1. The termination region TR surrounds the active region AR in a plan view parallel to the front surface of the semiconductor part 10 (e.g., the X-Y plane).

The semiconductor part 10 further includes, for example, a p-type guard ring layer 21, a p-type assist layer 23, and an n-type buffer layer 25. The p-type guard ring layer 21 and the p-type assist layer 23 are provided in the termination region TR.

The p-type guard ring layer 21 (a sixth layer) is provided at the front side of the semiconductor part 10. The p-type guard ring layer 21 is provided on the n-type base layer 11 at the boundary between the active region AR and the termination region TR. The gate trench GT closest in the X-direction to the termination region TR is positioned at, for example, the boundary between the active region AR and the termination region TR.

In a direction from the collector electrode 20 toward the emitter electrode 30, e.g., a Z-direction, the boundary between the n-type base layer 11 and the p-type guard ring layer 21 is positioned at a level lower than a level of the boundary between the n-type base layer 11 and the p-type base layer 13.

The p-type assist layer 23 (a seventh layer) is provided between the n-type base layer 11 and the collector electrode 20 in the termination region TR. The p-type assist layer 23 is in contact with the collector electrode 20 and electrically connected thereto. The p-type assist layer 23 is positioned between the p-type guard ring layer 21 and the collector electrode 20. The p-type assist layer 23 is provided with the p-type impurity concentration, for example, same as the p-type impurity concentration of the p-type collector layer 17.

The p-type assist layer 23 is apart from the p-type collector layer 17. A distance d1 in the X-direction from the p-type assist layer 23 to the p-type collector layer 17 is greater than a width d2 in the X-direction of the p-type assist layer 23. The width d2 of the p-type assist layer 23 is less than the minimum width of the p-type collector layer 17, e.g., a width d3 in the X-direction.

The n-type buffer layer 25 (an eighth layer) extends in the active region AR and the termination region TR. The n-type buffer layer 25 (the eighth layer) is provided between the n-type base layer 11 and the p-type collector layer 17. The n-type buffer layer 25 extends between the n-type base layer 11 and the n-type cathode layer 19 and between the n-type base layer 11 and the p-type assist layer 23. In the termination region TR, the n-type buffer layer 25 is provided between the n-type base layer 11 and the collector electrode 20, and contacts the collector electrode 20. The n-type buffer layer 25 extends between the p-type collector layer 17 and the p-type assist layer 23 that are apart from each other.

Figures 2A, 2B:
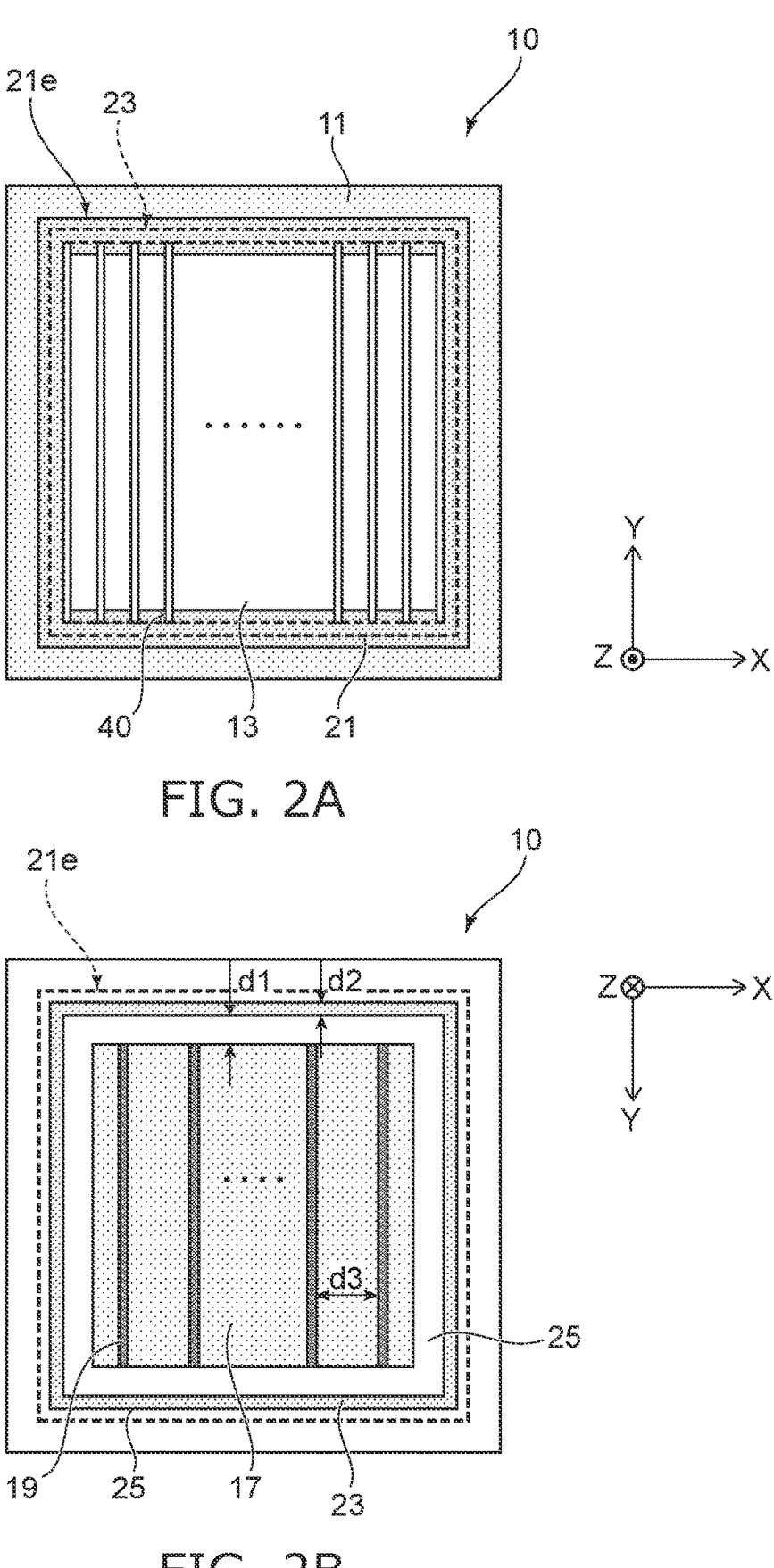
FIGS. 2A and 2B are schematic plan views showing the semiconductor device according to the embodiment.

FIGS. 2A and 2B are schematic plan views showing the semiconductor device 1 according to the embodiment. FIG. 2A is a plan view showing the front surface of the semiconductor part 10. FIG. 2B is a plan view showing the back surface of the semiconductor part 10. In FIG. 2A, the n-type emitter layer 15 and the p-type emitter layer 16 on the p-type base layer 13 are not illustrated (see FIG. 1).

As shown in FIG. 2A, multiple gate electrodes 40 are included. The gate electrodes 40 each extend in the Y-direction along the front surface of the semiconductor part 10. The multiple gate electrodes 40 are arranged in, for example, the X-direction. The p-type base layers 13 are provided between the gate electrodes 40 that are next to each other.

The p-type guard ring layer 21 surrounds the p-type base layers 13. The p-type guard ring layer 21 is linked to the p-type base layers 13. The p-type base layers 13 and the p-type guard ring layer 21 may be formed to have a shared body. The p-type guard ring layer 21 also surrounds the n-type emitter layer 15 and the p-type emitter layer 16 (not illustrated).

The p-type assist layer 23 surrounds the p-type base layer 13. The p-type assist layer 23 surrounds the n-type emitter layer 15 and the p-type emitter layer 16 (not illustrated).

As shown in FIG. 2B, for example, the p-type collector layer 17 and the n-type cathode layer 19 each extend in the Y-direction along the back surface of the semiconductor part 10. The p-type collector layer 17 and the n-type cathode layer 19, for example, are alternately arranged in the X-direction.

The p-type assist layer 23 surrounds the p-type collector layer 17 and the n-type cathode layer 19. The p-type assist layer 23 is positioned inward of an outer edge 21e of the p-type guard ring layer 21. The p-type assist layer 23 is apart from the p-type collector layer 17 and the n-type cathode layer 19. The distance d1 from the p-type collector layer 17 to the p-type assist layer 23 in the Y-direction is, for example, equal to a separation distance d1 in the X-direction between the p-type collector layer 17 and the p-type assist layer 23. Also, the distance d1 from the n-type cathode layer 19 to the p-type assist layer 23 in the Y-direction is equal to the separation distance d1 in the X-direction between the p-type collector layer 17 and the p-type assist layer 23.

The n-type buffer layer 25, for example, extends between the p-type assist layer 23 and the p-type collector layer 17 and between the p-type assist layer 23 and the n-type cathode layer 19. The n-type buffer layer 25 contacts the collector electrode 20 between the p-type collector layer 17 and the p-type assist layer 23. The n-type buffer layer 25 is also provided outward of the p-type assist layer 23.

In the semiconductor device 1, it is possible to improve the tolerance for overcurrent by providing the p-type assist layer 23 in the termination region TR. That is, when a short circuit takes place and large current flows in the on-state, for example, the p-type assist layer 23 suppresses the rise of the electric field inside the n-type base layer 11 by injecting holes into the n-type base layer 11. Thereby, the tolerance for short-circuit can be improved in the semiconductor device 1.

When the semiconductor device 1 operates, for example, at or below the rated current, a collector current flows between the collector electrode 20 and the emitter electrode 30. At this time, electrons are injected into the n-type base layer 11 via an inversion layer induced between the p-type base layer 13 and the gate insulating film 43, and corresponding thereto, holes are injected into the n-type base layer 11 from the p-type collector layer 17. In the operation at or below the rated current, the electrons and the holes are balanced inside the n-type base layer 11. Thus, the potential difference between the p-type base layer 13 and the p-type collector layer 17 is suppressed not to be large enough to inject holes into the n-type base layer 11 from the p-type assist layer 23 of the termination region TR.

On the other hand, when a large current such as a short-circuit current flows between the collector electrode 20 and the emitter electrode 30, the electrons are injected via the inversion layer between the p-type base layer 13 and the gate insulating film 43, and become excessive in the n-type base layer 11. Thus, the charge balance inside the n-type base layer 11 can no longer be maintained. Therefore, the potential difference between the p-type base layer 13 and the p-type collector layer 17 rises, and holes are injected from the p-type assist layer 23 into the n-type base layer 11. Thereby, the charge unbalance is suppressed inside the n-type base layer 11, and a further rise of the potential difference can be avoided between the p-type base layer 13 and the p-type collector layer 17.

When the p-type assist layer 23 is not provided, for example, the potential difference increases between the p-type base layer 13 and the p-type collector layer 17 due to the unbalanced charges inside the n-type base layer 11. In the active region AR, the charge unbalance is corrected by hole injection from the p-type collector layer 17, and the potential difference is eliminated. In the termination region TR, however, the p-type collector layer 17 is not provided, and the charge unbalance is not corrected by hole injection. Therefore, the potential difference is not eliminated at the boundary between the active region AR and the termination region TR, and the diffusion current generated in the undepleted region of the n-type base layer 11 may concentrate at the boundary between the active region AR and the termination region TR, resulting in the short-circuit breakdown.

The semiconductor device 1 includes the p-type assist layer 23 so that hole injection is also provided in the termination region TR. Thus, the tolerance for short-circuit can be improved in the semiconductor device 1. When the p-type assist layer 23 extends over the entire termination region TR, however, the breakdown voltage is reduced at the outer edge 21e of the p-type guard ring layer 21. In other words, the avalanche resistance is reduced through the turn-off process. Therefore, the p-type assist layer 23 is preferably provided to be positioned inward of the outer edge 21e of the p-type guard ring layer 21 in a plan view parallel to the back surface of the semiconductor part 10 (see FIG. 2B). In other words, the p-type assist layer 23 is preferably provided, for example, in the X-direction (or the Y-direction) to be positioned closer to the active region AR inside the outer edge 21e of the p-type guard ring layer 21.

Figure 3:
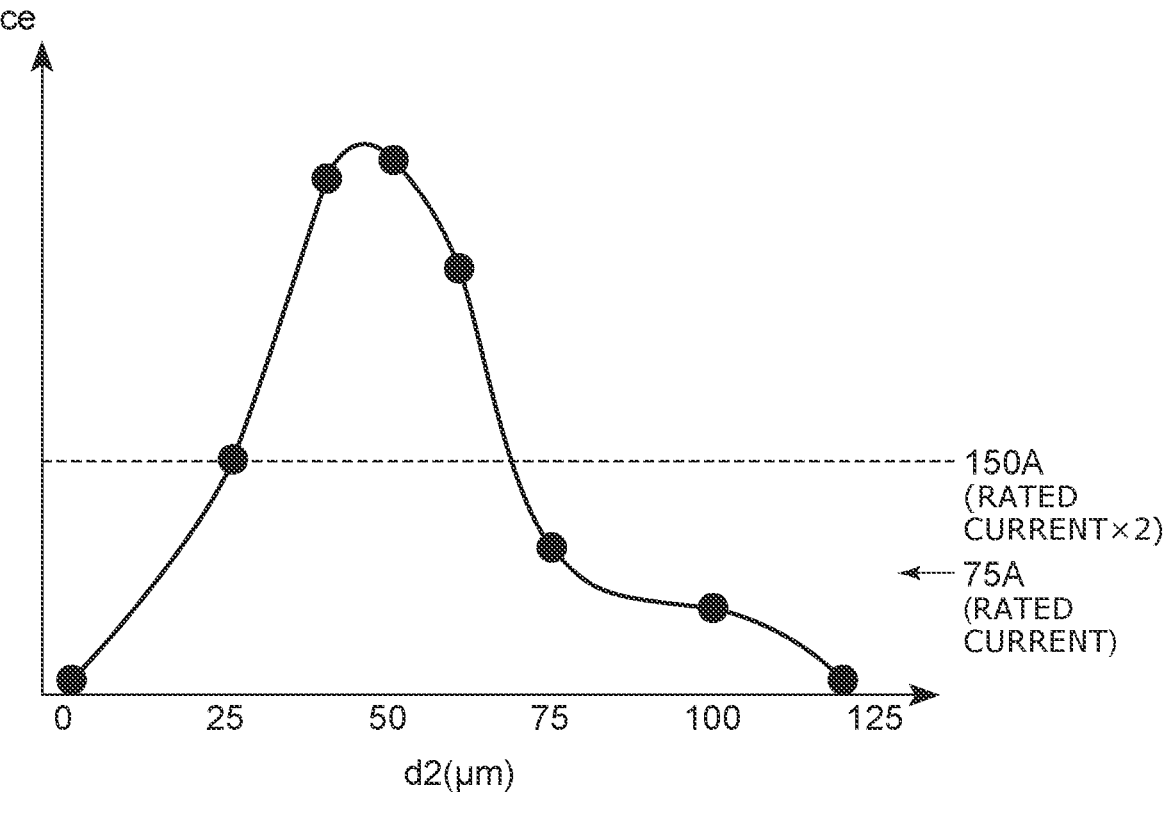
FIG. 3 is a graph showing a characteristic of the semiconductor device according to the embodiment.

FIG. 3 is a graph showing a characteristic of the semiconductor device 1 according to the embodiment. FIG. 3 is a graph showing the relationship between the width d2 of the p-type assist layer 23 and a collector current Ice at which the hole injection from the p-type assist layer 23 into the n-type base layer 11 starts. The horizontal axis is the width d2 of the p-type assist layer 23. The vertical axis is the collector current Ice.

As the width d2 of the p-type assist layer 23 decreases, the injection amount of the holes into the n-type base layer 11 decreases and approaches the characteristic when the p-type assist layer 23 is not provided. On the other hand, as the width of the p-type assist layer 23 increases, the hole amount injected from the p-type assist layer 23 into the n-type base layer 11 cannot be ignored even in the operating state at or below the rated current. Thus, the switching loss is increased in the turn-off period. In other words, the width d2 of the p-type assist layer 23 is preferably in a specific range for effective operation. The width d2 of the p-type assist layer 23, for example, is preferably not less than 25 micrometers and not more than 70 micrometers to inject holes at not less than 150 A which is 2 times the rated current.

Figures 4A, 4B:
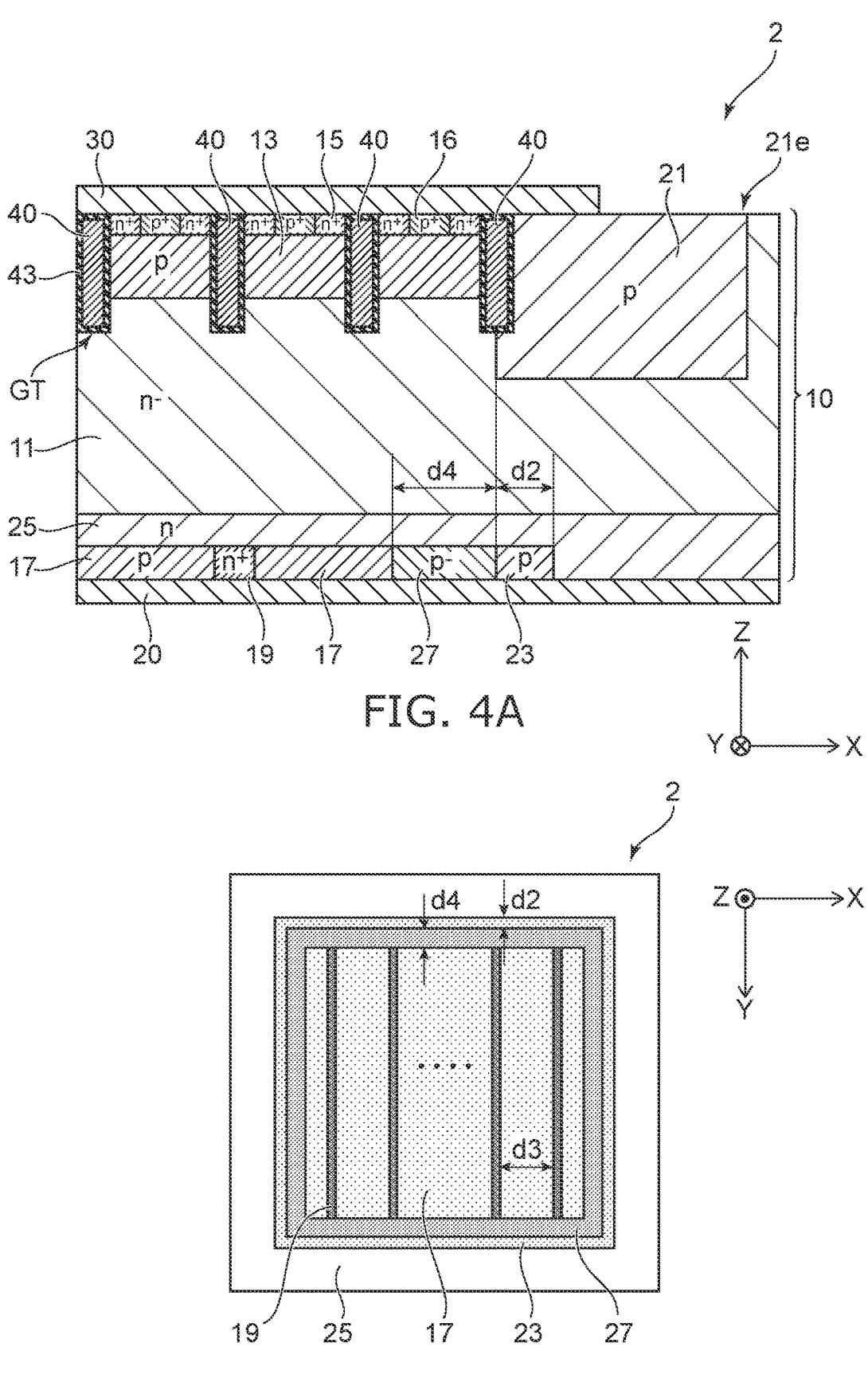
FIGS. 4A and 4B are schematic views showing a semiconductor device according to a modification of the embodiment.

FIGS. 4A and 4B are schematic views showing a semiconductor device 2 according to a modification of the embodiment. FIG. 4A is a cross-sectional view, and FIG. 4B is a plan view showing the back surface of the semiconductor part 10.

As shown in FIG. 4A, in the semiconductor device 2, a p-type low-concentration layer 27 (a ninth layer) is provided between the p-type collector layer 17 and the p-type assist layer 23. In the Z-direction, the p-type low-concentration layer 27 is provided between the collector electrode 20 and the n-type buffer layer 25. The p-type low-concentration layer 27 contacts the collector electrode 20 and the n-type buffer layer 25.

The p-type low-concentration layer 27 has a p-type impurity concentration lower than the p-type impurity concentration of the p-type collector layer 17 and the p-type impurity concentration of the p-type assist layer 23. In other words, the hole injection from the p-type low-concentration layer 27 into the n-type base layer 11 is less than the hole injection from the p-type collector layer 17 into the n-type base layer 11.

As shown in FIG. 4B, the p-type low-concentration layer 27 surrounds the n-type cathode layer 19 and the p-type collector layer 17. A width d4 in the X-direction and the Y-direction of the p-type low-concentration layer 27 is, for example, greater than the width d2 in the X-direction and the Y-direction of the p-type assist layer 23. Also, the width d4 of the p-type low-concentration layer 27 is less than the minimum width of the p-type collector layer 17, e.g., the width d3 in the X-direction.

Figure 5:
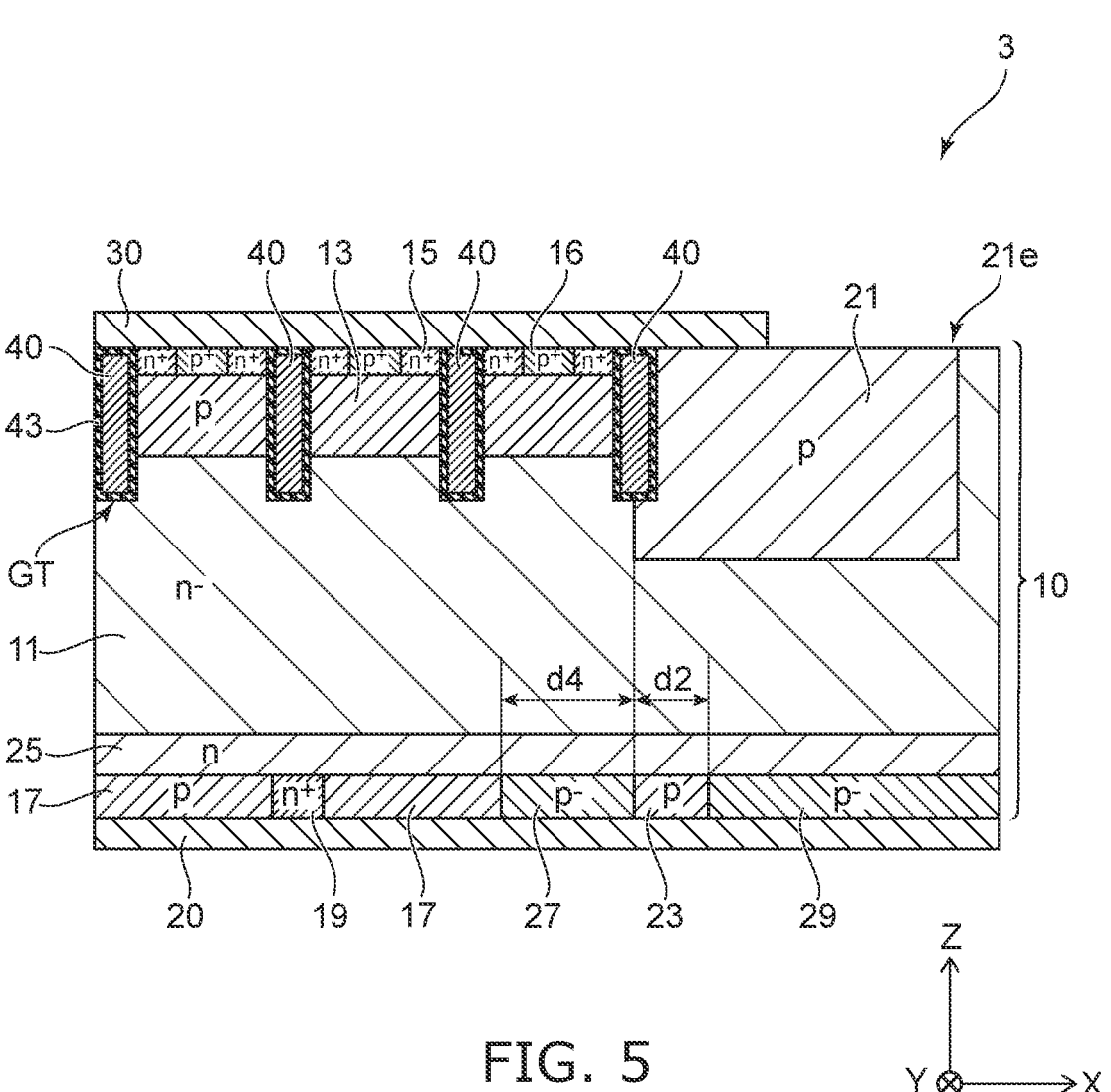
FIG. 5 is a schematic cross-sectional view showing a semiconductor device according to another modification of the embodiment.

FIG. 5 is a schematic cross-sectional view showing a semiconductor device 3 according to another modification of the embodiment. The semiconductor device 3 includes a second p-type low-concentration layer 29 (a tenth layer). The p-type low-concentration layer 29 is provided outward of the p-type assist layer 23. The p-type low-concentration layer 29, for example, is provided over the entire termination region TR (see FIG. 1). In the termination region TR, the p-type low-concentration layer 29 is provided between the collector electrode 20 and the n-type buffer layer 25.

The p-type impurity concentration of the p-type low-concentration layer 29 is less than the p-type impurity concentration of the p-type collector layer 17 and the p-type impurity concentration of the p-type assist layer 23. Therefore, it is possible in the semiconductor device 3 to increase the avalanche resistance of the outer edge 21e of the p-type guard ring layer 21.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a semiconductor part including an active region, and a termination region, the termination region surrounding the active region;
a first electrode provided on a back surface of the semiconductor part;
a second electrode provided on a front surface of the semiconductor part, the front surface being at a side opposite to the back surface; and
a control electrode provided between the semiconductor part and the second electrode,
the semiconductor part including first to eighth layers, the first, third, fifth and eighth layers being of a first conductivity type, the second, fourth, sixth and seventh layers being of a second conductivity type,
the first layer being provided between the first electrode and the second electrode,
the second layer being provided between the first layer and the second electrode in the active region,
the third layer being provided between the second layer and the second electrode,
the fourth and fifth layers being provided between the first layer and the first electrode in the active region, the fourth and fifth layers being arranged along the first electrode in a first direction,
the sixth layer being provided in the termination region and surrounding the second and third layers at the front side of the semiconductor part,
the seventh layer being provided between the first layer and the first electrode in the termination region, the seventh layer surrounding the fourth and fifth layers and being apart from the fourth and fifth layers,
a distance from the active region to an outer edge of the seventh layer in the first direction being less than a distance from the active region to an outer edge of the sixth layer in the first direction,
the eighth layer being provided between the first layer and the fourth layer, between the first layer and the fifth layer, and between the first layer and the seventh layer, wherein
the eighth layer has a first-conductivity-type impurity concentration greater than a first-conductivity-type impurity concentration of the first layer, and
the eighth layer extends entirely between the fourth layer and the seventh layer in a second direction perpendicular to the first direction and entirely between the fifth layer and the seventh layer in the second direction, while being in contact with the first electrode.

2. The device according to claim 1, wherein
the fourth layer, the fifth layer, and the seventh layer contact the first electrode.

3. The device according to claim 1, wherein
the fifth layer has a first-conductivity-type impurity concentration greater than the first-conductivity-type impurity concentration of the eighth layer.

4. The device according to claim 1, wherein
a distance from the fourth layer to the seventh layer in a first direction parallel to the back surface of the semiconductor part is greater than a width in the first direction of the seventh layer.

5. The device according to claim 4, wherein
the fourth layer has a minimum width in the first direction, the minimum width of the fourth layer is greater than the width in the first direction of the seventh layer.

6. The device according to claim 1, wherein
the semiconductor part includes a trench extending from the front surface into the first layer,
the control electrode is provided inside the trench, the control electrode being electrically insulated from the semiconductor part by a first insulating film and electrically insulated from the second electrode by a second insulating film,
the first layer and the second layer face the control electrode via the first insulating film, and
the third layer contacts the first insulating film between the second layer and the second electrode.

7. The device according to claim 6, wherein
the sixth layer surrounds the control electrode.

8. The device according to claim 1, wherein
the semiconductor part further includes an eleventh layer provided in the active region, the eleventh layer being provided between the second layer and the second electrode, the eleventh layer being of the second conductivity type, the eleventh layer having a second-conductivity-type impurity concentration greater than a second-conductivity-type impurity concentration of the second layer, and
the third layer and the eleventh layer are arranged on the second layer and contact the second electrode.

9. The device according to claim 1, wherein
the fourth layer and the fifth layer are repeatedly arranged in a direction parallel to the back surface, and
a distance between the fourth layer closest to the termination region and the termination region in the direction parallel to the back surface is shorter than a distance between the fifth layer closest to the termination region and the termination region in the direction parallel to the back surface.

10. A semiconductor device, comprising:
a semiconductor part including an active region, and a termination region, the termination region surrounding the active region;
a first electrode provided on a back surface of the semiconductor part;
a second electrode provided on a front surface of the semiconductor part, the front surface being at a side opposite to the back surface; and
a control electrode provided between the semiconductor part and the second electrode,
the semiconductor part including first to ninth layers, the first, third, fifth and eighth layers being of a first conductivity type, the second, fourth, sixth, seventh and ninth layers being of a second conductivity type,
the first layer being provided between the first electrode and the second electrode,
the second layer being provided between the first layer and the second electrode in the active region,
the third layer being provided between the second layer and the second electrode,
the fourth and fifth layers being provided between the first layer and the first electrode in the active region, the fourth and fifth layers being arranged along the first electrode in a first direction, the sixth layer being provided in the termination region and surrounding the second and third layers at the front side of the semiconductor part, the seventh layer being provided between the first layer and the first electrode in the termination region, the seventh layer surrounding the fourth and fifth layers and being apart from the fourth and fifth layers, a distance from the active region to an outer edge of the seventh layer in the first direction being less than a distance from the active region to an outer edge of the sixth layer in the first direction, the eighth layer being provided in an outer periphery of the seventh layer and physically in contact with the first electrode in the termination region, the ninth layer being provided between the fourth layer and the seventh layer and between the fifth layer and the seventh layer along an inner periphery of the seventh layer, wherein the ninth layer is of the second conductivity type, the ninth layer has a second-conductivity-type impurity concentration smaller than a second-conductivity-type impurity concentration of the fourth layer and a second-conductivity-type impurity concentration of the seventh layer, and the seventh layer is provided between the eighth layer and the ninth layer in the first direction while being in direct contact with the eighth layer and the ninth layer.

11. The device according to claim 10, wherein the ninth layer contacts the first electrode.

12. The device according to claim 10, wherein the semiconductor part further includes a tenth layer provided between the first layer and the first electrode, the seventh layer is provided between the active region and the tenth layer, and the tenth layer has a second-conductivity-type impurity concentration smaller than a second-conductivity-type impurity concentration of the fourth layer and a second-conductivity-type impurity concentration of the seventh layer.

13. The device according to claim 12, wherein the tenth layer contacts the first electrode.

14. The device according to claim 10, wherein the fourth layer and the fifth layer are repeatedly arranged in a direction parallel to the back surface, and a distance between the fourth layer closest to the termination region and the termination region in the direction parallel to the back surface is shorter than a distance between the fifth layer closest to the termination region and the termination region in the direction parallel to the back surface.

15. A semiconductor device, comprising:

a semiconductor part including an active region, and a termination region, the termination region surrounding the active region;

a first electrode provided on a back surface of the semiconductor part;

a second electrode provided on a front surface of the semiconductor part, the front surface being at a side opposite to the back surface; and a control electrode provided between the semiconductor part and the second electrode, the semiconductor part including first to seventh layers, the first, third and fifth layers being of a first conductivity type, the second, fourth, sixth and seventh layers being of a second conductivity type, the first layer being provided between the first electrode and the second electrode, the second layer being provided between the first layer and the second electrode, the third layer being provided between the second layer and the second electrode, the fourth and fifth layers being provided between the first layer and the first electrode, the fourth and fifth layers being arranged along the first electrode in a first direction, the sixth layer being provided in the termination region and surrounding the second and third layers at the front side of the semiconductor part, the seventh layer being provided between the first layer and the first electrode in the termination region, the seventh layer surrounding the fourth and fifth layers and being apart from the fourth and fifth layers, a distance from the active region to an outer edge of the seventh layer in the first direction being less than a distance from the active region to an outer edge of the sixth layer in the first direction, wherein the semiconductor part includes a trench extending from the front surface into the first layer, the control electrode is provided inside the trench and is electrically insulated from the semiconductor part by a first insulating film and is electrically insulated from the second electrode by a second insulating film, and the sixth layer is in direct contact with the first insulating film.

16. The device according to claim 15, wherein the fourth layer, the fifth layer, and the seventh layer contact the first electrode.

17. The device according to claim 15, wherein the semiconductor part further includes an eighth layer provided between the first layer and the fourth layer, between the first layer and the fifth layer, and between the first layer and the seventh layer, the eighth layer has a first-conductivity-type impurity concentration greater than a first-conductivity-type impurity concentration of the first layer, and the eighth layer extends between the fourth layer and the seventh layer and between the fifth layer and the seventh layer.

18. The device according to claim 15, wherein the eighth layer contacts the first electrode.

19. The device according to claim 15, wherein the fifth layer has a first-conductivity-type impurity concentration greater than the first-conductivity-type impurity concentration of the eighth layer.

20. The device according to claim 15, wherein the fourth layer and the fifth layer are repeatedly arranged in a direction parallel to the back surface, and a distance between the fourth layer closest to the termination region and the termination region in the direction parallel to the back surface is shorter than a distance between the fifth layer closest to the termination region and the termination region in the direction parallel to the back surface.

21. The device according to claim 15, wherein the semiconductor part further includes an eighth layer of the first conductivity type, the eighth layer locates in an outer periphery of the seventh layer and physically contacts the first electrode in the termination region, and the seventh layer is located between the ninth layer and the eighth layer while directly contacting the ninth layer and the eighth layer along a direction from the cell region to the termination region.

* * * * *